(12) United States Patent
Chiu

(10) Patent No.: US 7,924,062 B2
(45) Date of Patent: Apr. 12, 2011

(54) SAMPLING CIRCUITS

(75) Inventor: Pao-Cheng Chiu, Taipei County (TW)

(73) Assignee: Mediatek Inc., Hsin-Chu (TW)

( * ) Notice: Subject to any disclaimer, the term of this patent is extended or adjusted under 35 U.S.C. 154(b) by 2 days.

(21) Appl. No.: 12/503,105

(22) Filed: Jul. 15, 2009

(65) Prior Publication Data

US 2011/0012644 A1  Jan. 20, 2011

(51) Int. Cl.
G11C 27/02 (2006.01)
(52) U.S. Cl. .......................................... 327/94; 327/337
(58) Field of Classification Search ................. None
See application file for complete search history.

(56) References Cited

U.S. PATENT DOCUMENTS

| | | | |
|---|---|---|---|
| 5,410,270 A | 4/1995 | Rybicki et al. | |
| 6,166,581 A | 12/2000 | Liu et al. | |
| 6,433,632 B1 | 8/2002 | Nakamura et al. | |
| 6,433,712 B1 | 8/2002 | Ohnhaeuser et al. | |
| 6,546,150 B2 * | 4/2003 | Inui | 382/278 |
| 6,587,143 B1 | 7/2003 | Boisvert | |
| 7,015,842 B1 * | 3/2006 | Gupta et al. | 341/122 |
| 7,692,471 B2 * | 4/2010 | Uno | 327/337 |
| 7,741,984 B2 * | 6/2010 | Lee et al. | 341/122 |
| 2010/0117879 A1 * | 5/2010 | Ozeki et al. | 341/122 |

* cited by examiner

*Primary Examiner* — Lincoln Donovan
*Assistant Examiner* — Sibin Chen
(74) *Attorney, Agent, or Firm* — Thomas | Kayden

(57) ABSTRACT

A sampling circuit includes an amplifier, a sampling capacitor, a feedback capacitor, and a voltage source. The sampling capacitor and the feedback capacitor are coupled to the same input terminal of the amplifier, such that the offset of the amplifier and low-frequency noise can be cancelled. The voltage source can shift the voltage level of an output signal of the sampling circuit by the difference between the input and output common mode voltages of the amplifier, so that an amplifier having different input common mode voltage and output common mode voltage can be adopted, and the capacitance of the sampling capacitor and that of the feedback capacitor can be different, resulting in a non-unit gain.

16 Claims, 6 Drawing Sheets

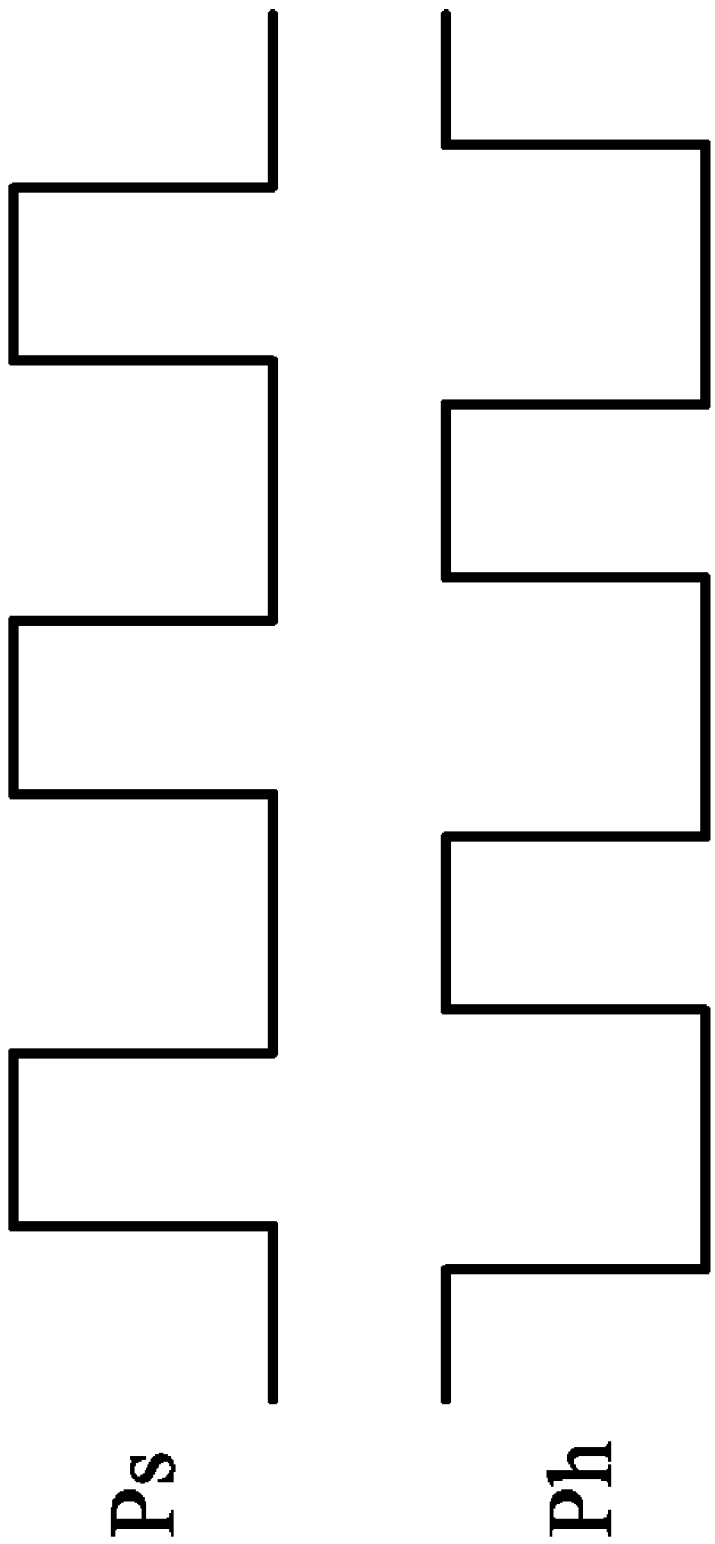

SAMPLING CIRCUITS

BACKGROUND OF THE INVENTION

1. Field of the Invention

The invention relates to a sampling circuit, and more particularly to a sampling circuit with offset cancellation and low-frequency noise cancellation.

2. Description of the Related Art

Generally, a sampling circuit with an operational amplifier (opamp) has a problem of opamp offset. In order to eliminate opamp offset in a sampling circuit, the operational amplifier is generally placed in a unit-gain feedback loop. However, the unit-gain feedback loop restricts the input common mode voltage and the output common mode voltage of the operational amplifier to be equal, which limits the type of operational amplifiers used in the sampling circuit. Moreover, because the gain of the sampling circuit is limited to be "1", the gain cannot be adjusted according to system requirements.

Thus, it is desired to provide a sampling circuit with an operational amplifier, which has opamp offset cancellation functionality and adjustable gain and can operate under different input and output common mode voltages.

BRIEF SUMMARY OF THE INVENTION

An exemplary embodiment of a sampling circuit operating in a sampling phase and a holding phase comprises an amplifier, a first switch, a first capacitor, a second capacitor, and a voltage source. The amplifier has a first input terminal and an output terminal for outputting an output signal. The first switch has a first terminal receiving an input signal and a second terminal coupled to a first node and turned on during the sampling phase. The first capacitor is coupled between the first node and the first input terminal and samples an input signal during the sampling phase. The second capacitor is coupled to the first input terminal. The second capacitor samples a reference signal during the sampling phase and receives charges from the first capacitor during the holding phase. The voltage source is coupled between the first input terminal and the output terminal. The voltage source shifts the output signal by a predetermined level during the sampling phase to eliminate difference between an input common mode voltage and an output common mode voltage of the amplifier.

Another exemplary embodiment of sampling circuit operating in a first phase and a second phase following the first phase comprises an amplifier, a first capacitor, a second capacitor, and a voltage source. The amplifier has a first input terminal and an output terminal for outputting an output signal. The first capacitor is coupled to the first input terminal and receives an input signal during the first phase and the second phase. The second capacitor is coupled to the first input terminal. The second capacitor samples a reference signal during the first phase and receives charges from the first capacitor during the second phase. The voltage source is coupled between the first input terminal and the output terminal. The voltage source shifts the output signal by a predetermined level during the first phase to eliminate difference between an input common mode voltage and an output common mode voltage of the amplifier.

A detailed description is given in the following embodiments with reference to the accompanying drawings.

BRIEF DESCRIPTION OF THE DRAWINGS

The invention can be more fully understood by reading the subsequent detailed description and examples with references made to the accompanying drawings, wherein:

FIG. 1b shows an exemplary embodiment of the voltage source in the sampling circuit of FIG. 1a;

FIG. 2 shows the clock signals of the sampling circuit in FIG. 1;

FIG. 3b shows an exemplary embodiment of the voltage source in the sampling circuit of FIG. 3a;

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
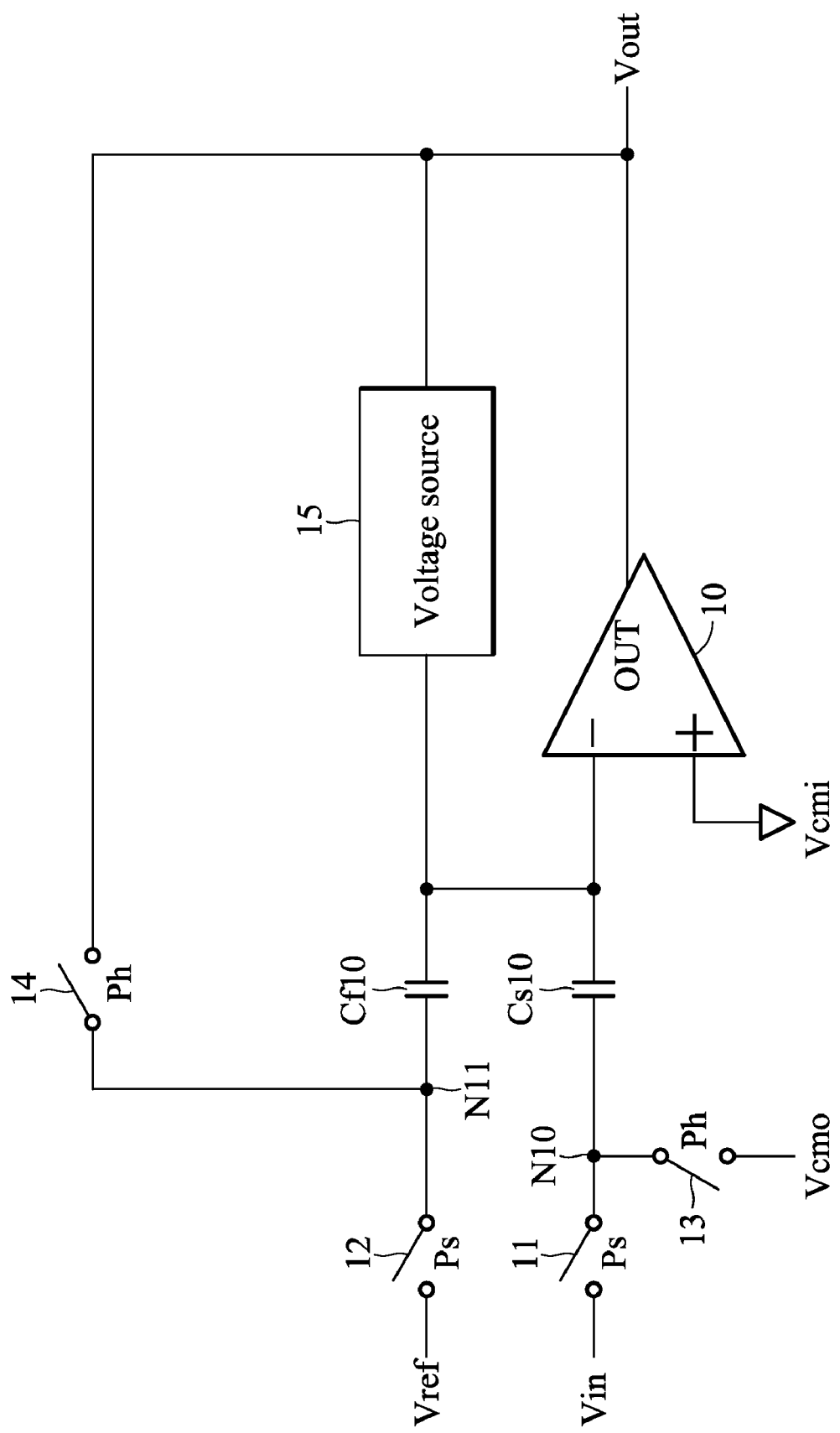
FIG. 1a shows an exemplary embodiment of a sampling circuit.

Sampling circuits are provided. In an exemplary embodiment shown in FIG. 1a, a sampling circuit operates in a sampling phase and a hold phase and may act as a sample-and-hold circuit. Referring to FIG. 1a, the sampling circuit comprises an amplifier 10, a sampling capacitor Cs10, a feedback capacitor Cf10, switches 11-14, and a voltage source 15. The amplifier 10 comprises a positive input terminal (+) coupled to a voltage source providing a voltage level equal to an input common mode voltage Vcmi of the amplifier 10, a negative input terminal (−), and an output terminal (OUT). The switch 11 has a first terminal receiving an input signal Vin and a second terminal coupled to a node N 0. The sampling capacitor Cs10 is coupled between the node N10 and the negative input terminal (−) of the amplifier 10. The switch 12 has a first terminal receiving a reference signal Vref and a second terminal coupled to a node N11. The feedback capacitor Cf10 is coupled between the negative input terminal 1 (−) of the amplifier 10 and the node N11. The switch 13 has a first terminal coupled to the node N10 and a second terminal receiving a voltage level arranged to be equal to an output common mode voltage Vcmo of the amplifier 10. The switch 14 has a first terminal coupled to the node N11 and a second terminal coupled to the output terminal (OUT) of the amplifier 10. The ON/OFF states of the switches 11 and 12 are determined according to a clock signal Ps corresponding to the sampling phase, while the ON/OFF states of the switches 13 and 14 are determined according to a clock signal Ph corresponding to the hold phase, as shown in FIG. 2.

Figure 1B:
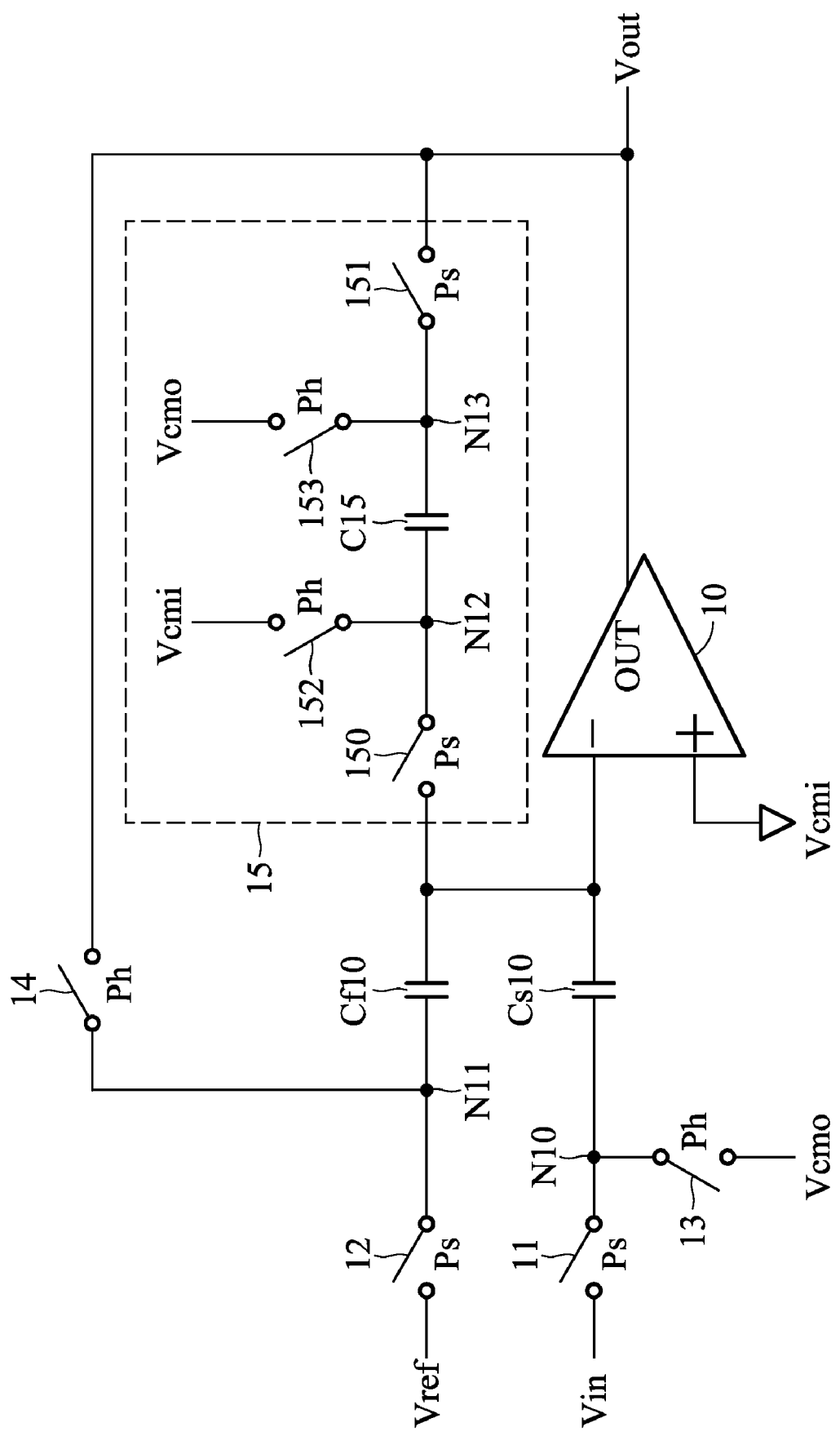

Referring to FIG. 1a, the voltage source 15 provides a voltage level substantially equal to the voltage difference between the input common mode voltage Vcmi and the output common mode voltage Vcmo of the amplifier 10. In one embodiment, the voltage source 15 can be implemented by a level shifter. This level shifter comprises switches 150-153 and a capacitor C15, as shown in FIG. 1b. The switch 150 has a first terminal coupled to the negative input terminal (−) of the amplifier 10 and a second terminal coupled to a node N12. The switch 151 has a first terminal coupled to the output terminal (OUT) of the amplifier 10 and a second terminal coupled to a node N13. The switch 152 is coupled between a voltage source providing a voltage level substantially equal to the input common mode voltage Vcmi and the node N12. The switch 153 is coupled between a voltage source providing a voltage level substantially equal to the output common mode voltage Vcmo and the node N13. The capacitor C15 is coupled between the nodes N12 and N13. The ON/OFF states of the switches 150 and 151 are determined according to the clock signal Ps, while the ON/OFF states of the switches 152 and 153 are determined according to the clock signal Ph. Referring to FIG. 2, when the clock signal Ph is asserted and the clock signal Ps is de-asserted (that is, during the holding phase), the switches 152 and 153 respectively couple the voltage sources to the terminals of the capacitor C15, the switches 150 and 151 decouple the capacitor C15 from the amplifier 10, and thereby the voltage drop of the capacitor C 15 is the voltage difference between the input common mode voltage Vcmi and the output common mode voltage Vcmo of the amplifier 10. In some embodiments, if the input common mode voltage and output common mode voltage of the amplifier 10 are equal, the voltage drop of the capacitor C 15 is substantially equal to zero.

Referring to FIGS. 1b and 2, during a following sampling phase, the clock signal Ph is de-asserted and the clock signal Ps is asserted to control the switch 11 to transmit the input signal Vin to the sampling capacitor Cs10, control the switch 12 to transmit the reference signal Vref to the feedback capacitor Cf10, and control the switches 150 and 151 to couple the capacitor C15 to the amplifier 10. The sampling capacitor Cs10 samples the input signal Vin, and the feedback capacitor Cf10 samples the reference signal Vref. Since the difference between the input common mode voltage Vcmi and output common mode voltage Vcmo of the amplifier 10 has been stored into the capacitor C15 during the previous holding phase, the level of the output signal Vout is first shifted by the voltage difference during this sampling phase.

During a following holding phase, the clock signal Ps is de-asserted and the clock signal Ph is asserted again. Since the output common mode voltage Vcmo is provided to the node N10 through the switch 13, the charges of the sampling capacitor Cs10 is pushed to the feedback capacitor Cf10, and the charges of the feedback capacitor Cf10 is also pushed to the output terminal (OUT) of the amplifier 10, so that a gain substantially equal to Cf10/Cs10 is obtained at the output signal Vout.

According to the above operations, by providing a voltage level substantially equal to (Vcmi-Vcmo) between the input terminal (−) and the output terminal OUT of the amplifier 10 during the sampling phase, the amplifier 10 is not necessarily placed in a unit-gain feedback loop to sample the offset of the amplifier 10. Thus, the capacitance of the sampling capacitor Cs10 and the capacitance of the feedback capacitor Cf10 are not required to be equal, which results in an adjustable gain coefficient, and the amplifier 10 can be implemented by an amplifier with different or equal input and output common mode voltages, such as a telescopic amplifier with low power consumption and less noise.

Moreover, since one plate of the sampling capacitor Cs10 and one plate of the feedback capacitor Cf10 are coupled to the negative input terminal (−) of the amplifier 10, the offset of the amplifier 10 and low-frequency noise can be cancelled during the holding phase.

Figure 3A:
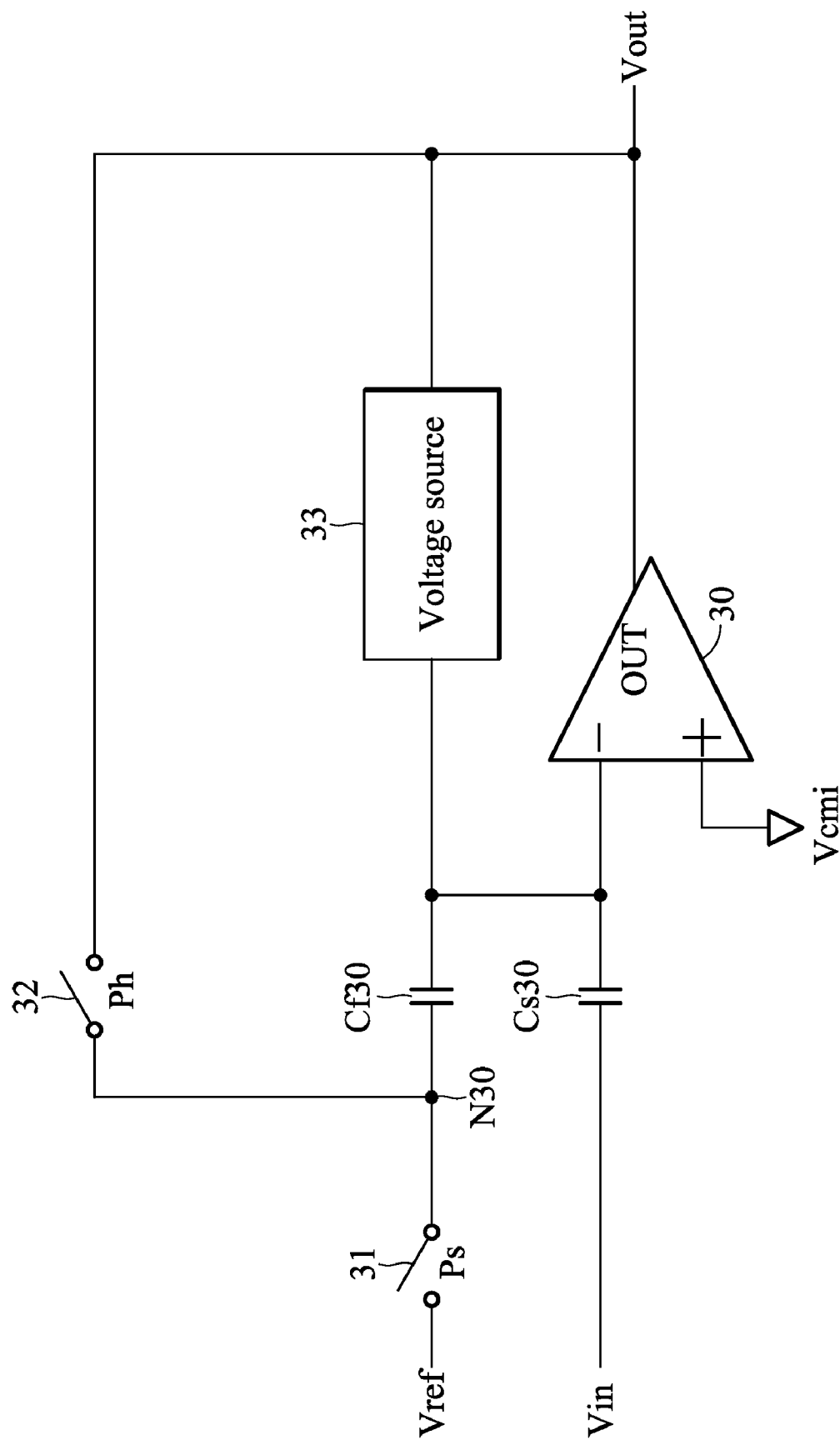
FIG. 3a shows another exemplary embodiment of a sampling circuit.

FIG. 3a shows another exemplary embodiment of a sampling circuit. Referring to FIG. 3a, a sampling circuit alternately operates in a data phase and a reset phase and comprises an amplifier 30, a sampling capacitor Cs30, a feedback capacitor Cf30, switches 31-32, and a voltage source 33. The amplifier 30 comprises a positive input terminal (+) receiving a voltage level substantially equal to the input common mode voltage Vcmi of the amplifier 30, a negative input terminal (−), and an output terminal (OUT). The sampling capacitor Cs30 has one plate receiving the input signal Vin and the other plate coupled to the negative input terminal (−) of the amplifier 30. The switch 31 has a first terminal receiving a reference signal Vref and a second terminal coupled to a node N30. The feedback capacitor Cf30 is coupled between the negative input terminal I (−) of the amplifier 30 and the node N30. The switch 32 has a first terminal coupled to the node N30 and a second terminal coupled to the output terminal (OUT) of the amplifier 30. The ON/OFF states of the switch 31 is determined according to a clock signal Ps corresponding to the reset phase, while the ON/OFF states of the switch 32 is determined according to a clock signal Ph corresponding to the data phase, as shown in FIG. 4.

Figure 3B:
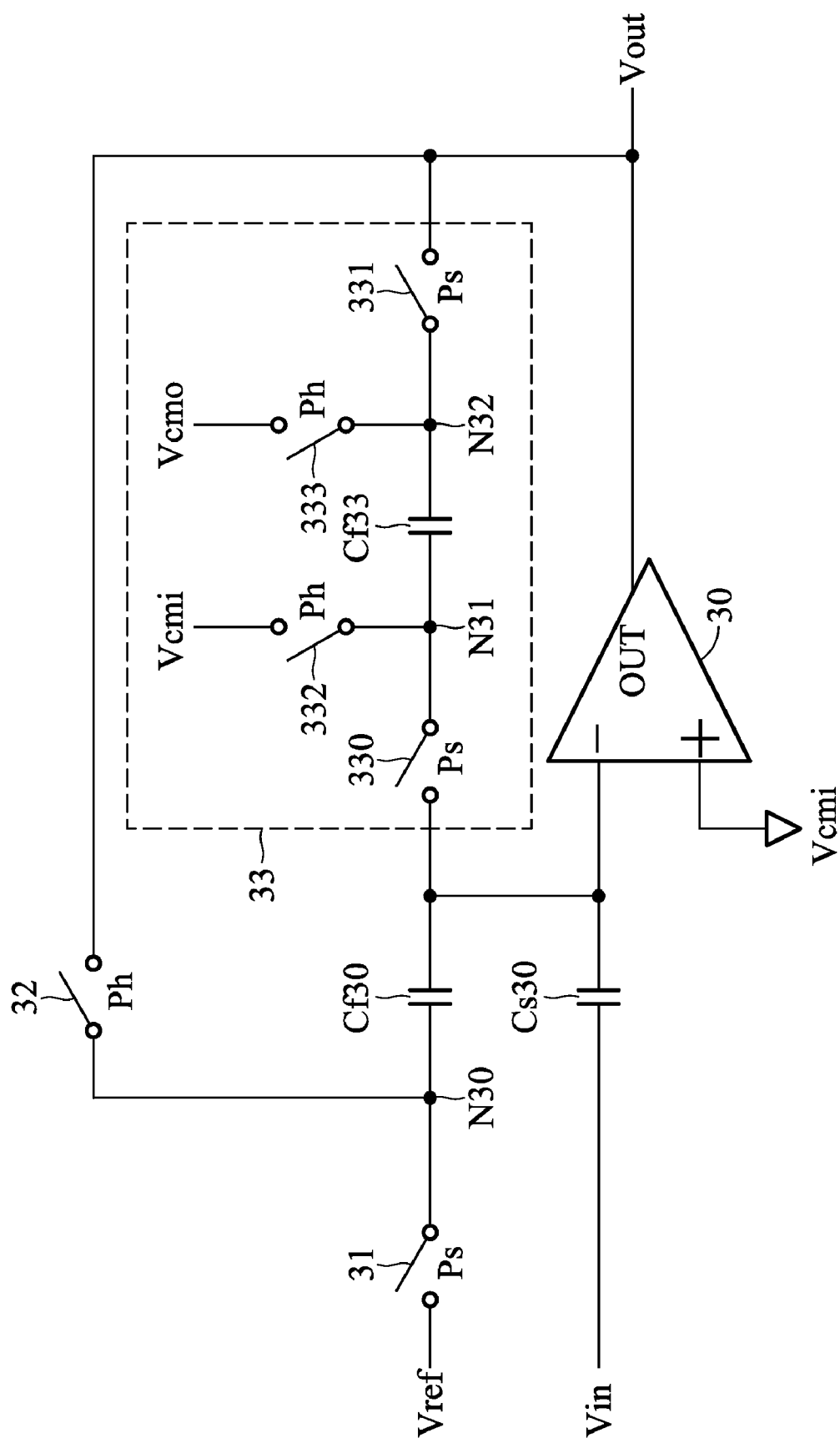

Referring to FIG. 3a, the voltage source 33 provides a voltage level substantially equal to the difference between the input common mode voltage Vcmi and an output common mode voltage Vcmo of the amplifier 30. In one embodiment, the voltage source 33 can be implemented by a level shifter. This level shifter comprises switches 330-333 and a capacitor C33, as shown in FIG. 3b. The switch 330 has a first terminal coupled to the negative input terminal (−) of the amplifier 30 and a second terminal coupled to a node N31. The switch 331 has a first terminal coupled to the output terminal (OUT) of the amplifier 10 and a second terminal coupled to a node N32. The switch 332 is coupled between a voltage source providing a voltage level substantially equal to the input common mode voltage Vcmi and the node N31. The switch 333 is coupled between a voltage source providing a voltage level substantially equal to the output common mode voltage Vcmo and the node N32. The capacitor C33 is coupled between the nodes N31 and N32. The ON/OFF states of the switches 330 and 331 are determined according to the clock signal Ps, while the ON/OFF states of the switches 332 and 333 are determined according to the clock signal Ph. When the clock signal Ph is asserted and the clock signal Ps is de-asserted (that is, during the data phase), the voltage drop of the capacitor Cf33 is the difference between the input common mode voltage Vcmi and the output common mode voltage Vcmo of the amplifier 10. In some embodiments, if the input common mode voltage and output common mode voltage of the amplifier 10 are equal, the voltage difference stored in the capacitor Cf33 is substantially equal to zero.

In one embodiment, the sampling circuit is utilized as a correlated double sampling circuit for pixel sampling, and the input signal Vin is a charge-coupled device (CCD) signal provided from an image sensor, such as a digital camera or a scanner. As shown in FIG. 4, a CCD signal is a stream of pixels from a charge-coupled device, and each pixel comprises a reset level Lreset and a data level Ldata. A CCD signal may introduce an error which exists from one pixel to another due to different reset level Lreset of the pixels (the error is referred to as reset error). Thus, to remove the reset error, the reset level Lreset and the data level Ldata of each pixel need to be sampled to obtain the difference between the reset level Lreset and the data level Ldata.

Figure 4:
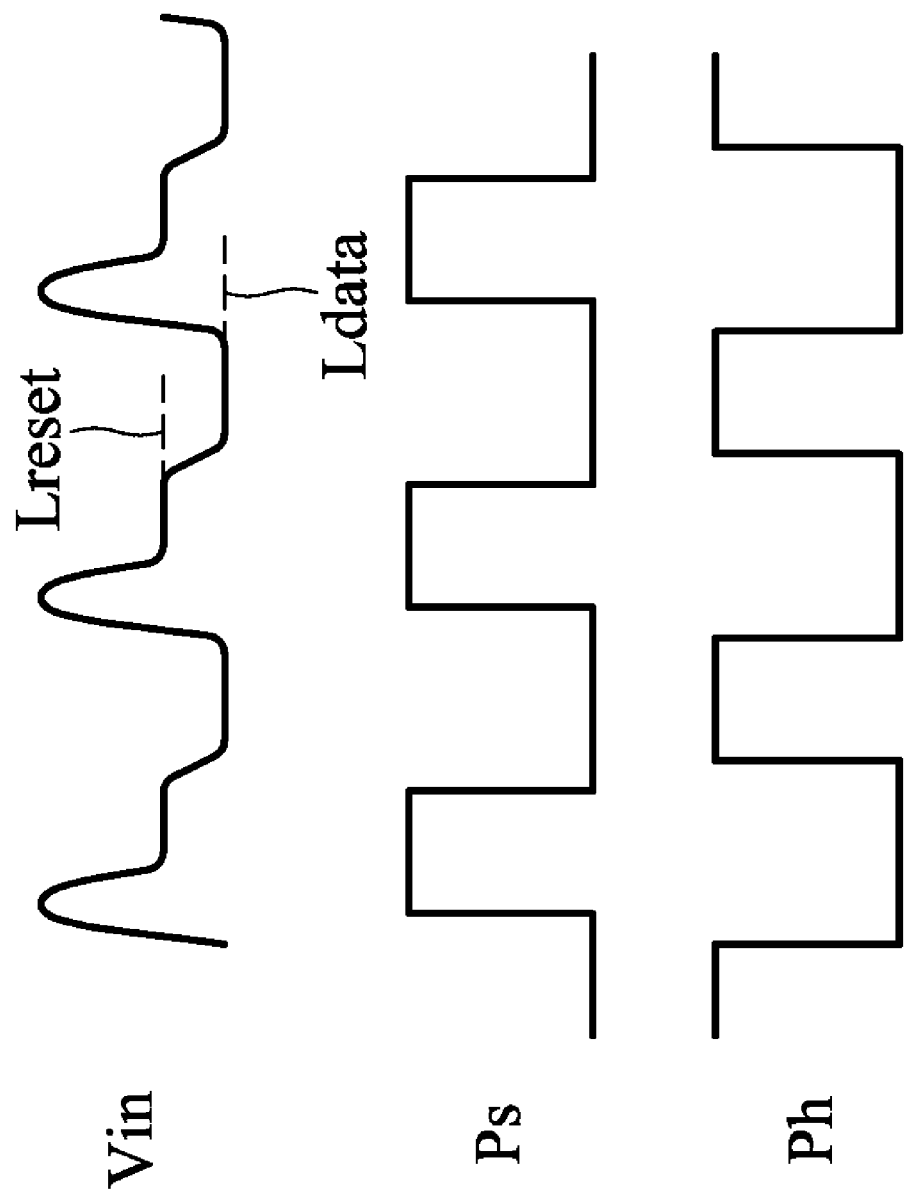
FIG. 4 shows the input signal and the clock signals of the sampling circuit in FIG. 3.

Referring to FIGS. 3b and 4, during a following reset phase, the clock signal Ps is asserted and the clock signal Ph is de-asserted. The reference signal is therefore inputted to the feedback capacitor Cf30, and a voltage level equal to (Vcmi-Vcmo) is provided between the negative input terminal (−) and the output to shift the output signal Vout by the voltage difference. The sampling capacitor Cs30 samples the reset level of the input signal Vin, and the feedback capacitor Cf30 samples the reference signal Vref.

During a following data phase, the clock signal Ps is de-asserted to control the switches 31, 330, and 331 to decouple the reference signal Vref from the node N30 and decouple the capacitor Cf33 from the nodes N31 and N32, and the clock signal Ph is asserted to control the switches 32, 332, and 333 to couple the node N30 to the output terminal OUT of the amplifier and couple the capacitor Cf33 to the voltage sources. The voltage applied to the sampling capacitor Cs30 is changed by (Lreset-Ldata). The feedback capacitor Cf30 receives the charges from the sampling capacitor Cs30 and then pushes the charges to the output terminal (OUT). Thus, the voltage level of the output signal Vout is changed according to the difference (Lreset-Ldata).

According to the foregoing description of the structure and operation of inventive embodiments, the sampling circuit acts as a correlated double sampling circuit for a CCD signal. The amplifier 30 of the correlated double sampling circuit is not necessarily placed in a unit-gain feedback to sample the offset of the amplifier 30. The input common mode voltage and output common mode voltage of the amplifier 30 are not required to be equal, and the amplifier 30 can be implemented by an amplifier with different or equal input and output common mode voltages, such as a telescopic amplifier with low power consumption and less noise.

Moreover, since one plate of the sampling capacitor Cs30 and one plate of the feedback capacitor Cf30 are coupled to the negative input terminal (−) of the amplifier 30, the offset of the amplifier 30 and the low-frequency noise can be cancelled during the holding phase.

In the embodiment, the capacitance of the sampling capacitor Cs30 can be equal to or different from the capacitance of the feedback capacitor Cf30, therefore the gain of the sampling circuit can be adjusted according to system requirements.

For illustrative clarity, the sampling circuits of FIG. 1a, FIG. 1b, FIG. 3a, and FIG. 3b are shown as single-ended structures. However, as a person with ordinary skill in the art would readily appreciate, the above-mentioned sampling circuits can be implemented with differential structures as well. Further descriptions of the differential structures are omitted here for the sake of brevity. These modifications still fall within the scope of the present invention.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A sampling circuit operating in a sampling phase and a holding phase, comprising:
    an amplifier having a first input terminal and an output terminal for outputting an output signal;
    a first capacitor, coupled to the first input terminal, for sampling an input signal during the sampling phase;
    a second capacitor, having a first terminal coupled to the first input terminal and a second terminal coupled to the output terminal during the holding phase and decoupled from the output terminal during the sampling phase, for sampling a reference signal during the sampling phase and receiving charges from the first capacitor during the holding phase; and
    a voltage source, coupled between the first input terminal and the output terminal, for providing a predetermined voltage level during the sampling phase to eliminate difference between an input common mode voltage and an output common mode voltage of the amplifier;
    wherein the input common mode voltage of the amplifier is different from the reference signal; and
    wherein the output common mode voltage of the amplifier is different from the reference signal.

2. The sampling circuit as claimed in claim 1, wherein the voltage source comprises:
    a third capacitor, coupled between the first input terminal and the output terminal during the sampling phase, for providing a voltage drop corresponding to the difference between the input common mode voltage and the output common mode voltage.

3. The sampling circuit as claimed in claim 2, wherein the voltage source further comprises:
    a first switch having a first terminal coupled to the first input terminal and a second terminal coupled to the third capacitor at a second node;
    a second switch having a first terminal coupled to the output terminal and a second terminal coupled to the third capacitor at a third node;
    a third switch coupled between a first voltage source and the second node; and
    a fourth switch coupled between a second voltage source and the third node;
    wherein during the sampling phase, the first and second switches are turned on, and the third and fourth switches are turned off; and
    wherein during the holding phase, the first and second switches are turned off, and third and fourth switches are turned on.

4. The sampling circuit as claimed in claim 3, wherein the first voltage source provides a voltage equal to the input common mode voltage, and the second voltage source provides a voltage equal to the output common mode voltage.

5. The sampling circuit as claimed in claim 1, wherein the input common mode voltage and the output common mode voltage of the amplifier are not the same, and the predetermined voltage level is determined according to the difference between the input common mode voltage and the output common mode voltage.

6. The sampling circuit as claimed in claim 1 further comprising:
    a first switch having a first terminal receiving the input signal and a second terminal coupled to the first capacitor at a first node;
    a second switch having a first terminal receiving the reference signal and a second terminal coupled to the second capacitor at a second node;
    a third switch having a first terminal coupled to the first node and a second terminal receiving the output common mode voltage of the amplifier; and
    a fourth switch having a first terminal coupled to the second node and a second terminal coupled to the output terminal;
    wherein during the sampling phase, the first and second switches are turned on, and the third and fourth switches are turned off; and
    wherein during the holding phase, the first and second switches are turned off, and the third and fourth switches are turned on.

7. The sampling circuit as claimed in claim 1, wherein a capacitance of the first capacitor and a capacitance of the second capacitor are different.

8. A sampling circuit operating in a first phase and a second phase, comprising:
    an amplifier having a first input terminal and an output terminal for outputting an output signal;
    a first capacitor, coupled to the first input terminal, for sampling an input signal during the first phase and the second phase;
    a second capacitor, having a first terminal coupled to the first input terminal and a second terminal coupled to the output terminal during the second phase and decoupled from the output terminal during the first phase, for sampling a reference signal during the first phase and receiving charges from the first capacitor during the second phase; and a voltage source, coupled between the first input terminal and the output terminal, for providing a predetermined voltage level during the first phase to eliminate difference between an input common mode voltage and an output common mode voltage of the amplifier.

9. The sampling circuit as claimed in claim 8, wherein the voltage source comprises:

a third capacitor, coupled between the first input terminal and the output terminal during the first phase, for providing a voltage drop corresponding to the difference between the input common mode voltage and the output common mode voltage.

10. The sampling circuit as claimed in claim 9, wherein the voltage source further comprises:

a first switch having a first terminal coupled to the first input terminal and a second terminal coupled to the third capacitor at a first node;

a second switch having a first terminal coupled to the output terminal and a second terminal coupled to the third capacitor at a second node;

a third switch coupled between a first voltage source and the first node; and a fourth switch coupled between a second voltage source and the second node;

wherein during the first phase, the first and second switches are turned on, and the third and fourth switches are turned off; and wherein during the second phase, the first and second switches are turned off, and the third and fourth switches are turned on.

11. The sampling circuit as claimed in claim 10, wherein the first voltage source provides a voltage equal to the input common mode voltage, and the second voltage source provides a voltage equal to the output common mode voltage.

12. The sampling circuit as claimed in claim 8, wherein the input common mode voltage and the output common mode voltage of the amplifier are not the same, and the predetermined voltage level is determined according to the difference between the input common mode voltage and the output common mode voltage.

13. The sampling circuit as claimed in claim 8 further comprising:

a first switch having a first terminal receiving the reference signal and a second terminal coupled to the second capacitor at a first node; and a second switch having a first terminal coupled to the first node and a second terminal coupled to the output terminal;

wherein during the first phase, the first switch is turned on, and the second switch is turned off; and wherein during the second phase, the first switch is turned off, and the second switch is turned on.

14. The sampling circuit as claimed in claim 8, wherein the input signal is a charge-coupled device (CCD) signal.

15. The sampling circuit as claimed in claim 8, being a correlated double sampling circuit.

16. The sampling circuit as claimed in claim 8, wherein a capacitance of the first capacitor and a capacitance of the second capacitor are different.

* * * * *